United States Patent [19]

Graham et al.

[11] Patent Number: 5,081,327
[45] Date of Patent: Jan. 14, 1992

[54] SEALING SYSTEM FOR HERMETIC MICROCHIP PACKAGES

[75] Inventors: Dana R. Graham, Poway; Kenneth L. Jones, II, Escondido, both of Calif.

[73] Assignee: Cabot Corporation, Waltham, Mass.

[21] Appl. No.: 500,693

[22] Filed: Mar. 28, 1990

[51] Int. Cl.⁵ .................. H01L 23/02; H05K 5/00; H05K 5/06; H01S 4/00
[52] U.S. Cl. .................. 174/52.4; 174/17 VA; 174/52.3; 357/74; 29/592.1
[58] Field of Search .......... 65/34, 36, 59.5, 59.21; 174/52.4, 52.3, 52.2, 52.1, 17.05, 17.07, 17 VA; 437/215, 218, 219; 357/74, 72, 73; 29/592.1

[56] References Cited

U.S. PATENT DOCUMENTS

| | | | |
|---|---|---|---|
| 3,826,634 | 7/1974 | Blust et al. | 65/34 |
| 4,769,345 | 9/1988 | Butt et al. | 437/217 |
| 4,861,944 | 8/1989 | Jones, II et al. | 174/68.5 |
| 4,931,854 | 6/1990 | Yonemasu et al. | 357/74 |

FOREIGN PATENT DOCUMENTS

| | | | |
|---|---|---|---|
| 0188850 | 11/1982 | Japan | 437/215 |
| 0188851 | 11/1982 | Japan | 437/215 |
| 0278353 | 11/1988 | Japan | 437/215 |

*Primary Examiner*—Leo P. Picard
*Assistant Examiner*—Bot Ledynh

[57] ABSTRACT

A sealable hermetic microchip package includes a vent therein that permits gas to escape during the sealing operation, but then itself is sealed at the completion of the sealing operation to render the package hermetic. The venting of gas from the interior of the package avoids the buildup of internal pressure during the sealing operation that can introduce bubbles and other faults into the sealing material. The vent may be a channel in the sealing surface of the lid of the package that is initially open, and then fills with the seal material as it flows to effect the seal. The vent may also be a hole in the lid that is sealed by the flow of a bead of the seal material. An equivalent approach to venting provided that the lid be mounted on standoffs that flow during sealing to permit the lid to settle onto the base of the package.

19 Claims, 1 Drawing Sheet

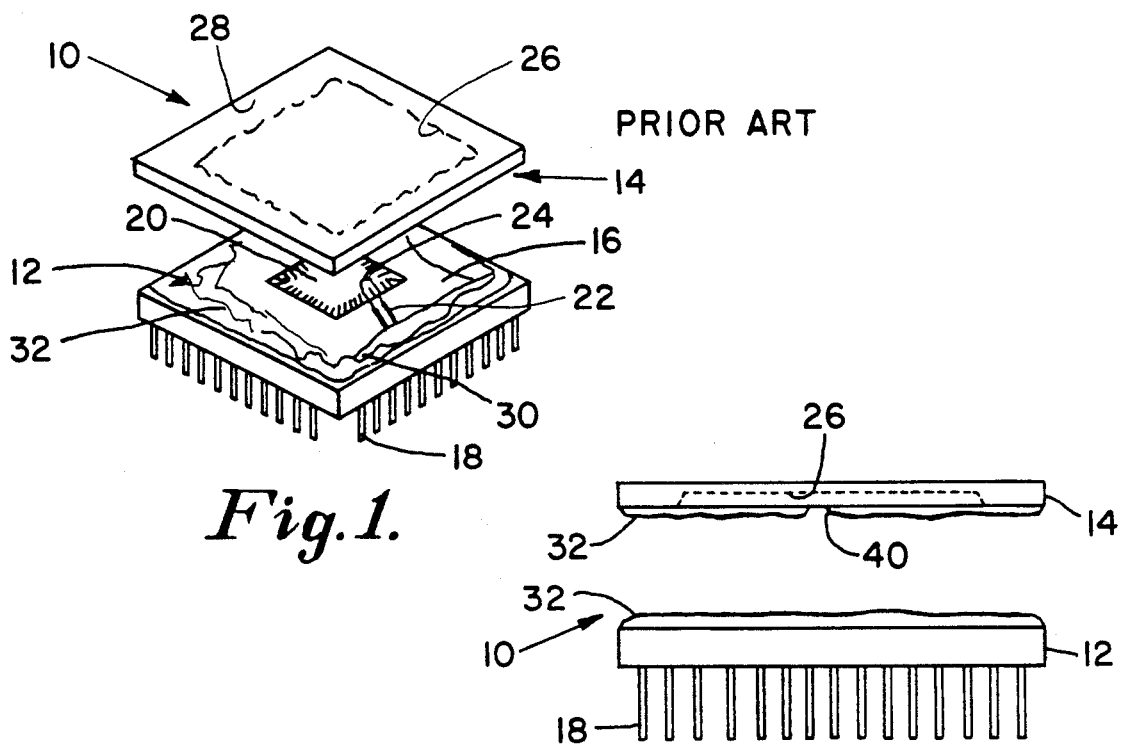
Fig.1.
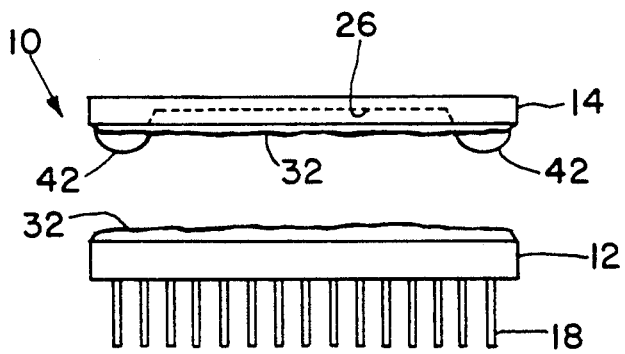
Fig.2.
Fig.3.
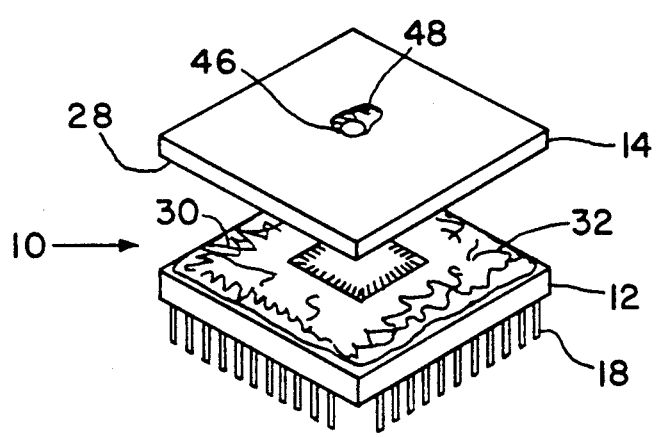
Fig.4.

5,081,327

SEALING SYSTEM FOR HERMETIC MICROCHIP PACKAGES

BACKGROUND OF THE INVENTION

This invention relates to the hermetic packaging of microcircuits, and, more particularly, to an approach for improving the sealing of the package.

Integrated circuits, also termed microchips, are electronic devices that are extremely miniaturized, so that hundreds or even thousands of individual circuits and active elements fit into a space that may be only ⅛ inch on a side. The microchips themselves are small and fragile. They must therefore be packaged and protected in a manner that permits external electrical connections to be made, and permits the integrated circuits to be handled in a normal manner during the assembly and repair of electronic devices that may utilize the microcircuits.

One approach to packaging the microchips is to mount them on a ceramic base having electrical connector pins extending through the base and sealed to the base to be gas tight. Electrical connection pads on the microchip are connected to the pins with fine wires and conducting paths called traces. A ceramic cover or lid having a recess therein to accommodate the microchip is placed over the upper surface of the base, with a sealing surface of the lid contacting the upper surface of the base.

The lid is sealed to the base with a layer of a flowable material, preferably a glass, that is placed between the upper surface of the base and the sealing surface of the lid. The package is heated to a temperature at which the glass flows, effecting the seal. The final package is desirably completely sealed against the intrusion of gases, moisture, and potentially damaging chemicals from the environment into the interior of the package, ensuring the operation of the microchip even in adverse circumstances.

While this sealing approach is desirably accomplished, it has been observed by many companies in the industry that there are faults in the seal between the base and the lid in a fraction of the packages. These faults are sometimes apparent to the eye, and in other cases are discovered only by X-raying the package. The faults may extend through the entire width of the sealing surface from the interior to the exterior, so that in fact no complete seal is achieved. In other cases, the fault extends through a portion of the width of the sealing surface, making its detection more difficult. Even in these cases, the fault can permit the flow of gas or liquid into the interior of the package over a period of exposure, leading to accelerated failure of the microchip.

There exists a need for an improved sealing approach for hermetic microchip packages to achieve an unfaulted seal that provides both initial and extended-term hermetic sealing of the microchip in the package. The sealing approach should be highly reliable, and should not be excessively expensive to implement. The present invention fulfills this need, and further provides related advantages.

SUMMARY OF THE INVENTION

The present invention provides a package and sealing method for microchips that achieves a fault-free seal of the lid to the base. Gas and liquid cannot pass into the interior of the package to damage the microchip, as the faults that previously provided migration paths are removed. The present approach utilizes accepted and proved glass sealing technology, but modifies that technology so as to prevent the formation of the faults previously observed. In some forms, it can be implemented without additional cost. The sealing approach actually improves the seal by providing a compressive sealing force against the seal material, which is desirable in the case of ceramic or glass seal materials that are susceptible to cracking when loaded in tension.

In accordance with the invention, a package for hermetically mounting a microcircuit comprises a gas impervious base having an upper surface thereof, a location on the upper surface for mounting a microchip, and a plurality of electrical interconnects extending therethrough, the interconnects being sealed to the base; a lid that fits over the base, the lid having a recess therein that accommodates the microchip when the lid is placed upon the base and a sealing surface that fits to the upper surface of the base; a seal material extending around the periphery of the base such that the sealing surface of the lid rests on the seal material when it is placed upon the upper surface of the base, the seal material being flowable when heated to a flow temperature to seal the lid to the base; and vent means for permitting gas to escape from the interior of the recess during heating of the package to effect sealing, and then for sealing at about the flow temperature of the seal material.

In one embodiment, the vent means includes a vent channel in the sealing surface of the lid such that the channel remains open until the seal material is heated to the flow temperature and seals the channel. In another form, the vent means includes a hole through the lid having a bead of the seal material therein, the bead of sealing material becoming flowable at the flow temperature and sealing the hole. In yet another embodiment, the lid has a set of standoffs on the underside thereof that raise the sealing surface from the upper surface of the base, and the vent means is formed as a gap between the sealing surface and the upper surface of the base, the standoffs being formed of a material, preferably the seal material, that flows at the flow temperature of the sealing material so that the standoffs flow and the lid settles onto the upper surface of the base to seal the vent.

The present invention is based upon an understanding of the mechanism of the formation of the faults in the seal material previously observed in hermetically sealed packages. The faults appear to be produced by the formation of gas bubbles as expanding gas escapes from the interior of the package during the sealing operation. To seal the package, the preferred glass seal material is first applied to the sealing surface of the lid and the facing portion of the upper surface of the base. The lid is placed upon the base, with the microchip in place on the base, and the assembly heated. During heating, the glass seal material softens at a temperature of 325°-350° C. and forms a partial seal that is not fully hermetic but is apparently sufficient to trap gas within the interior of the package.

The assembly is further heated to about 410°-430° C. so that the glass becomes flowable to complete the seal. During the further heating, the trapped gas expands further. As the glass becomes more flowable and thence less able to resist the expanding gas, the gas can form bubbles in the seal material as the gas seeks to expand outwardly. These bubbles are the origin of the faults observed in the completed packages. If the internal pressure is sufficiently high, the bubbles can penetrate through to the exterior of the package, with the result that there is no sealing of the package. Even if the bubble does not penetrate through to the surface, when the package is cooled the bubble remains as a fault that extends partially through the width of the sealing surface and can serve as a path for migration of gas or liquid to the interior of the package.

The present approach permits the venting of the expanding gas up to the maximum temperature to which the package is heated during the sealing operation, and then seals the vent at that maximum temperature. The most direct way to accomplish the sealing is to place the vent at a location at which the seal material can flow into the vent at the maximum temperature, so that upon cooling the vent is sealed. Alternatively, a separate bead of the seal material can be positioned such that it flows into the vent when the maximum temperature is reached. Using the same material to seal the vent as is used to seal the lid to the base ensures that the vent will be closed at the proper temperature to prevent gas-expansion type faults in the seal between the lid and the base.

Thus, the invention also extends to a process for accomplishing the sealing of the lid to the base. In accordance with this aspect of the invention, a process for sealing a hermetic microchip package comprises the steps of providing a base with a microchip mounted thereon and a lid with a recess therein that fits over the microchip and rests upon the base; placing a sealing material between the base and the portion of the lid that rests upon the base, the base, lid, and sealing material jointly forming the package; flowing the sealing material to seal the lid to the base; permitting gas to escape from the interior of the package prior to the completion of the step of flowing, and then prohibiting further gas flow after the completion of the step of flowing.

The present approach avoids the formation of gas-expansion faults in the sealed package, and is accomplished with little if any additional cost. The partial vacuum within the package resulting from the contraction of the gas within the package upon cooling aids in forcing the lid against the base. This places the lid-to-base seal in compression, reducing the chances that it will fail during service. Other features and advantages of the invention will be apparent from the following detailed description of the preferred embodiments, taken in conjunction with the accompanying drawings, which illustrate, by way of example, the principles of the invention.

BRIEF DESCRIPTION OF THE DRAWINGS

FIG. 1 is a perspective partially exploded view of a microchip package;

FIG. 2 is a side view of a package utilizing one embodiment of the invention;

FIG. 3 is a side view of a package utilizing another embodiment of the invention; and FIG. 4 is a perspective partially exploded view of a package utilizing yet another embodiment of the invention.

DETAILED DESCRIPTION OF THE PREFERRED EMBODIMENTS

FIG. 1 illustrates a conventional hermetic package 10, including a ceramic base 12 and a ceramic lid 14 that fits against a top surface 16 of the base 12. A plurality of electrical connection pins 18 extend through the base 12. A microchip 20 is fastened to the central portion of the top surface 16 of the base 12. Electrical connection locations on the microchip are connected to the upper ends of the pins 18 with a combination of traces 22 and fine wires 24. More detail of one type of package 10, which is the preferred application of the present invention, is found in U.S. Pat. No. 4,861,944, whose disclosure is incorporated herein by reference. Although the preferred embodiment is described in relation to this particular package, the invention is not so limited. The invention may be utilized in any type of hermetic packaging, most advantageously with solder glass sealing.

The lid 14 has a central recess 26 that accommodates the raised microchip 20. The sides of the lid 14 lateral of the recess 26 form a sealing surface 28 that rests upon a lateral margin 30 of the top surface 16 of the base 12. To effect sealing of the lid 14 to the base 12, the sealing surface 28 of the lid and the lateral margin 30 of the base 12 are covered with a seal material 32. The seal material 32 is preferably a glass such as Owens Illinois Sealing Glass SG401, which has a composition of about 74-78 weight percent lead oxide, about 10 weight percent boron oxide, about 5 weight percent zirconium oxide, about 4 weight percent zinc oxide, about 0.4-4 percent titanium oxide, balance minor amounts of other oxide forming elements. The lid 14 is placed upon the base 12 in the manner described, and the assembly is heated at a rate of about 40°-80° C. per minute to the flow temperature of the glass, typically 410°-430° C. This temperature is maintained for about 6-10 minutes, and then the sealed package is cooled. With this conventional approach, faults are observed in some packages, within the flowed seal material.

The origin of the faults has been traced to gas expansion within the recess 26 during heating of the assembly to effect sealing. As the assembly is heated, the air within the recess expands and escapes through the crack between the lid 14 and the base 12. When the temperature reaches the glass softening temperature of about 325°-350° C., the glass undergoes a small amount of movement that is insufficient to effect complete sealing, but in many cases achieves a partial sealing of the recess 26. The partial sealing does not occur in every instance, and its occurrence is not predictable, but when it does happen, faults can result in the manner to be described next.

As the temperature is raised further to the glass flow temperature of 410°-430° C., the air inside the recess expands further. If partial sealing has occurred, the gas cannot be exhausted from the recess 26, and a pressure within the recess 26 is created. The increasing temperature softens the glass sealing material 32 even further, so that at some point the internal pressure may force a bubble into the seal material 32, and may even force the bubble to penetrate to the exterior to release the pressure. If these events occur at a stage in the heating cycle where the damage cannot be repaired by the glass flow, as for example just as cooling commences, then the fault will be frozen into the package and remain in the final product. Tests have shown that such faults often lead to premature failure of the microchip 20 during service.

The present invention recognizes the origin of the faults and provides a vent that releases the internal pressure generated during heating the package in the sealing process. The vent is then self-sealed during the sealing process to complete the hermetic seal of the package, or may be later sealed to achieve particular atmosphere requirements within the package. The term "vent" is intended to be given a broad interpretation, including but not limited to sealable holes, grooves, or openings. Those skilled in the art will appreciate that other geometries than those discussed herein will be operable.

In accordance with the invention, a package for hermetically mounting a microcircuit comprises a gas impervious base having an upper surface thereof, a location on the upper surface for mounting a microchip, and a plurality of electrical interconnects extending therethrough, the interconnects being sealed, to the base; a lid that fits over the base, the lid having a recess therein that accommodates the microchip when the lid is placed upon the base and a sealing surface that fits to the upper surface of the base; a seal material extending around the periphery of the base such that the sealing surface of the lid rests on the seal material when it is placed upon the upper surface of the base, the seal material being flowable when heated to a flow temperature to seal the lid to the base; and a vent that communicates from the interior of the recess of the lid to the external environment, the vent remaining unsealed during heating of the package to effect sealing and then becoming sealed at about the flow temperature of the seal material.

A most preferred approach is illustrated in FIG. 2. A channel 40 is provided through the lid 14 along the sealing surface 28, from the recess 26 in the interior of the lid 14 to the exterior of the package 10. In one example, the channel 40 is roughly in the form of a trapezoid in cross section, as illustrated in FIG. 2, with a bottom dimension of about 0.020 inches, a top dimension (at the open end) of about 0.050 inches, and a height of about 0.005 inches. The lid 14 sits upon the base 12, and more specifically the sealing surface 28 sits upon the solid seal material 32 prior to its becoming flowable. In this preferred approach, the base 12 is made of aluminum oxide, the lid 14 is made of aluminum oxide, and the seal material 32 is the previously discussed SG401 sealing glass in a thickness of about 0.010–0.016 inch.

Before the lid 14 is assembled to the base 12, the seal material 32 is coated onto the lateral margin, 30 of the base 12, the sealing surface 28 of the lid 14, or both by forming a slurry of the glass and screen printing. The coated pieces are heated to a temperature of about 380°–420° C. for 2–5 minutes at the peak temperature to achieve bonding to these surfaces in an operation called glazing. The microchip 20 is then fastened to the base 12 using conventional techniques, and the electrical connections are made using conventional techniques.

The lid 14 is placed onto the base 12, and the assembly placed into on a conveyer that travels through a furnace maintained at 410°–430° C. The assembly is heated at 40°–80° C. per minute to the glass softening temperature of 325°–350° C., and then heating continues to the glass flow temperature of 410°–430° C. The presence of the channel 40 ensures that there can be no gas pressure buildup within the interior of the package 10 and specifically within the recess 26. When the package 10 reaches the glass flow temperature, the glass flows into the channel 40 and blocks it. The package 10 is then cooled as it leaves the furnace. The glass seal material solidifies, sealing the lid 14 to the base 12, and also sealing the channel 40 closed.

Another approach is illustrated in FIG. 3. Here, the lid 14 is furnished with four standoffs 42, one at each corner of the sealing surface 28. The lid 14 is suspended above the base 12 and the seal material 32, until the flow temperature is reached. The space between the lid 14 and the base 12 permits gas to escape from the interior of the recess 26 during heating. The standoffs 42 flow when the flow temperature of the glass is reached, permitting the lid 14 to settle downwardly and seal to the base 12.

Yet another approach is illustrated in FIG. 4. A vent hole 46 is formed through the lid 14 (or through the base) to communicate the recess 26 with the external environment. A bead 48 of flowable material, preferably the same material as used for the seal material 32, is placed within the vent hole 46 or adjacent its upper end. During heating, the vent hole 46 permits the escape of gas. When the maximum or flow temperature is reached, the bead 48 flows blocking the vent hole 46, and completing the sealing of the package 10.

Sealing can also be achieved by permitting the part with a vent therein to cool, and then utilizing a post-heating sealing operation with solder glass or a metallic solder, for example. In one version of the latter approach, a metallization is applied to the regions adjacent the vent in a step of the package fabrication prior to sealing. The metallization might be, for example, a refractory metal such as tungsten, molybdenum, or an alloy such as molybdenum-manganese, plated with nickel. The metallization might also be a thin film such as an alloy of silver-30 weight percent palladium. After the package has been heated to the sealing glass flow temperature and cooled, then a bead of a conventional soft solder is soldered to the metallization.

The resulting product of such a post-heating sealing approach, where the package is cooled to ambient temperature before sealing, has no negative internal pressure, whereas the packages sealed at elevated temperature have negative internal pressure within the recess after the package is cooled to ambient temperature. Either of these differing pressure states may be desirable in various situations. A related approach is to place the vented package, prior to sealing, into a controlled atmosphere to backfill the package with a particular gas, and then to complete the sealing.

Packages have been prepared using both the embodiment described in relation to FIG. 2 and the embodiment described in relation to FIG. 3. These packages were uniformly free of the types of faults previously observed with conventional packages and sealing approaches.

Although a particular embodiment of the invention has been described in detail for purposes of illustration, various modifications may be made without departing from the spirit and scope of the invention. Accordingly, the invention is not to be limited except as by the appended claims.

What is claimed is:

1. A package for hermetically mounting a microcircuit, comprising:
    a gas impervious base having an upper surface thereof, a location on the upper surface for mounting a microchip, and a plurality of electrical interconnects extending therethrough, the interconnects being sealed to the base;
    a lid that fits over the base, the lid having a recess therein that accommodates the microchip when the lid is placed upon the base and a sealing surface that fits to the upper surface of the base;
    a seal material extending around the periphery of the base such that the sealing surface of the lid rests on the seal material when it is placed upon the upper surface of the base, the seal material being flowable when heated to a flow temperature to seal the lid to the base; and a vent that communicates from the interior of the recess of the lid to the external environment, the vent remaining unsealed during heating of the package to effect sealing and then becoming sealed at about the flow temperature of the seal material.

2. The package of claim 1, wherein the vent is a hole through the lid having a bead of the seal material at the top thereof, the bead of sealing material becoming flowable at the flow temperature and sealing the hole.

3. The package of claim 1, wherein the vent is a vent channel in the sealing surface of the lid such that the channel remains open until the seal material is heated to the flow temperature and seals the channel.

4. The package of claim 1, wherein the lid has a set of standoffs on the underside thereof that raise the sealing surface from the upper surface of the base, and the vent is formed as a gap between the sealing surface and the upper surface of the base, the standoffs being formed of a material that flows at the flow temperature of the sealing material so that the standoffs flow and the lid settles onto the upper surface of the base to seal the vent.

5. The package of claim 4, wherein the standoffs are formed of the seal material.

6. The package of claim 1, wherein the seal material is a glass.

7. The package of claim 1, further including a microchip mounted on the base.

8. A package for hermetically mounting a microcircuit, comprising:

a gas impervious base having an upper surface thereof, a location on the upper surface for mounting a microchip, and a plurality of electrical interconnects extending therethrough, the interconnects being sealed to the base;

a lid that fits over the base, the lid having a recess therein that accommodates the microchip when the lid is placed upon the base and a sealing surface that fits to the upper surface of the base;

a seal material extending around the periphery of the base such that the sealing surface of the lid rests on the seal material when it is placed upon the upper surface of the base, the seal material being flowable when heated to a flow temperature to seal the lid to the base; and vent means for permitting gas to escape from the interior of the recess during heating of the package to effect sealing, and then for sealing at about the flow temperature of the seal material.

9. The package of claim 8, wherein the vent means includes a hole through the lid having a bead of the seal material therein, the bead of sealing material becoming flowable at the flow temperature and sealing the hole.

10. The package of claim 8, wherein the vent means includes a vent channel in the sealing surface of the lid such that the channel remains open until the seal material is heated to the flow temperature and seals the channel.

11. The package of claim 8, wherein the lid has a set of standoffs on the underside thereof that raise the sealing surface from the upper surface of the base, and the vent means is formed as a gap between the sealing surface and the upper surface of the base, the standoffs being formed of a material that flows at the flow temperature of the sealing material so that the standoffs flow and the lid settles onto the upper surface of the base to seal the vent.

12. The package of claim 11, wherein the standoffs are formed of the seal material.

13. The package of claim 8, wherein the seal material is a glass.

14. The package of claim 8, further including a microchip mounted on the base.

15. A process for sealing a hermetic microchip package, comprising the steps of:

providing a base with a microchip mounted thereon and a lid with a recess therein that fits over the microchip and rests upon the base;

placing a sealing material between the base and the portion of the lid that rests upon the base, the base, lid, and sealing material jointly forming the package;

flowing the sealing material to seal the lid to the base;

permitting gas to escape from the interior of the package prior to the completion of the step of flowing, and then prohibiting further gas flow after the completion of the step of flowing.

16. The process of claim 15, wherein the step of permitting is accomplished by providing a vent that communicates from the interior of the package to the external evironment prior to completion of the step of flowing, and then is sealed after completion of the step of flowing.

17. The process of claim 16, wherein the vent is a hole in the lid and having sealing material therein that flows and seals the hole during the step of flowing.

18. The process of claim 16, wherein the vent is a vent channel positioned such that the seal material between the base and the lid flows into the channel during the step of flowing.

19. The process of claim 16, wherein the vent is a space between the base and the lid formed by supporting the lid on standoffs made of the seal material which flow during the step of flowing so that the lid settles onto the sealing material and closes the vent.

* * * * *